(12) United States Patent
Kang et al.

(10) Patent No.: US 7,413,402 B2
(45) Date of Patent: Aug. 19, 2008

(54) ELECTRICAL APPARATUS

(75) Inventors: Chi-Jen Kang, Taipei (TW); Jui-Yao Shih, Taipei (TW)

(73) Assignee: Asustek Computer Inc., Taipei (TW)

( * ) Notice: Subject to any disclaimer, the term of this patent is extended or adjusted under 35 U.S.C. 154(b) by 334 days.

(21) Appl. No.: 11/041,308

(22) Filed: Jan. 25, 2005

(65) Prior Publication Data

US 2005/0249603 A1 Nov. 10, 2005

(30) Foreign Application Priority Data

May 5, 2004 (TW) .............................. 93112695 A

(51) Int. Cl.
*F01D 25/28* (2006.01)
(52) U.S. Cl. ................................... 415/213.1; 361/695
(58) Field of Classification Search ............. 415/213.1, 415/214.1; 454/184; 361/695
See application file for complete search history.

(56) References Cited

U.S. PATENT DOCUMENTS

| | | | | |
|---|---|---|---|---|
| 6,215,659 B1 * | 4/2001 | Chen | ........................... | 361/695 |
| 6,343,011 B1 * | 1/2002 | Yu | .............................. | 361/695 |
| 6,547,540 B1 * | 4/2003 | Horng et al. | ........... | 417/423.14 |
| 6,717,810 B2 * | 4/2004 | Shyr | ........................... | 361/695 |
| 6,817,939 B2 * | 11/2004 | Gan et al. | .................... | 454/184 |
| 6,999,313 B2 * | 2/2006 | Shih | ............................ | 361/695 |

* cited by examiner

*Primary Examiner*—Edward K. Look
*Assistant Examiner*—Devin Hanan
(74) *Attorney, Agent, or Firm*—Bacon & Thomas, PLLC

(57) ABSTRACT

An electrical apparatus comprises a casing and a fan-fastening base. The casing has a first opening, at least one second opening and a first connecting portion. The second opening connects to a first side of the first opening. The fan-fastening base has at least one hook portion, a first surface and a second connecting portion. At least one fan is fastened to the first surface of the fan-fastening base. The hook portion buckles in the second opening. The first surface of the fan-fastening base faces to the first opening and the second connecting portion connects to the first connecting portion.

10 Claims, 8 Drawing Sheets

ELECTRICAL APPARATUS

BACKGROUND OF THE INVENTION

1. Field of Invention

The invention relates to an electrical apparatus and, in particular, to an electrical apparatus having a fan, which is easily replaced.

2. Related Art

The electronic technology has been developed for a long time, so that the electrical apparatuses with faster processing speed are manufactured according to the progressed technology. The heat generated accompanying with the operation of the electrical apparatus must be dissipated with a heat-dissipation device installed inside the electrical apparatus, so that the operation performance of the electrical apparatus can be maintained. Regarding to the heat-dissipation device of a computer host, a fan is installed on the casing of the computer for dissipating the heat of the computer. If the fan malfunctions, the temperature of the electrical devices of the computer will increase. When the temperature reaches a threshold value, the computer may crash. To avoid this, the malfunctioned fan must be disassembled, and a new fan must be then installed.

In general, the conventional fan is installed on the casing of the computer with guiding rails or a pivot. With reference to FIGS. 1a and 1b, a fan 12 is fixed on a casing 14 with guiding rails 141 and screws 13. A first surface 111 of the base 11 carries at least one fan 12, and two protruding portions 112 are disposed at two edges of the first surface 111 respectively. In addition, two screws 13 are disposed at two edges of a second surface 113 of the base 11. Besides, the casing 14 has two guiding rails 141 located at the positions corresponding to the protruding portions 112, and has two screw holes 142 located at the positions corresponding to the screws 13. The protruding portions 112 of the base 12 carrying the fan 12 are then slid into the guiding rails 141. Finally, the base 11 is in contact with the casing 14, and the screws 13 are assembled with the screw holes 142 so as to fasten the fan 12 on the casing 14. This method for fastening the fan needs the guiding rails and screws, and the provided structure, which is complex and needs lots of assembling elements, usually has higher cost.

Alternatively, with reference to FIG. 2, the fan 12 is fastened on the casing 14 with a pivot 143. The first surface 111 of the base 11 carries at least one fan 12, and one edge of the first surface 111 is installed with cylindrical portions 114. The screw 13 is disposed at one edge of the second surface 113 of the base 11. The casing 14 has a pivot 143 located at the position corresponding to the cylindrical portions 114, and has a screw hole 142 located at the positions corresponding to the screw 13. After the fan 12 is carried on the base 12, the cylindrical portions 114 of the base 11 are assembled with the pivot 143. Finally, the base 11 is in contact with the casing 14, and the screw 13 is assembled with the screw hole 142 so as to fasten the fan 12 on the casing 14. This method for fastening the fan needs the pivot and screw, and the provided structure, which also is complex and needs lots of assembling elements, usually has higher cost.

It is therefore an important subjective of the invention to provide an electrical apparatus, which can solve the above-mentioned problems so as to make the assembling and disassembling procedures of a fan much easier for the customers or operating members of the manufacturer.

SUMMARY OF THE INVENTION

In view of the foregoing, the invention is to provide an electrical apparatus, which has easier assembling and disassembling procedures of a heat-dissipating fan.

To achieve the above, an electrical apparatus of the invention includes a casing and a fan-fastening base. In the invention, the casing has a first opening, at least one second opening and a first connecting portion. The second opening connects to a first side of the first opening. The fan-fastening base has at least one hook portion, a first surface and a second connecting portion. At least one fan is fastened to the first surface of the fan-fastening base. The hook portion buckles in the second opening. The first surface of the fan-fastening base faces to the first opening and the second connecting portion connects to the first connecting portion.

As mentioned above, the electrical apparatus of the invention utilizes the hook portion to buckle the second opening and the second connecting portion to connect with the first connecting portion. Accordingly, the fan-fastening base can be fixed on the casing without the conventional guiding rails or pivot, which needs lots of screws for assembling the fan. Thus, the fan can be assembled or disassembled easily, which results in the saved manpower and time-consumption for disassembling or assembling the fan. Furthermore, since the structure of the invention is simple, the cost for the casing and fan-fastening base can be decreased.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

An electrical apparatus according to a preferred embodiment of the invention includes a casing 21 and a fan-fastening base 22.

Figure 1A:
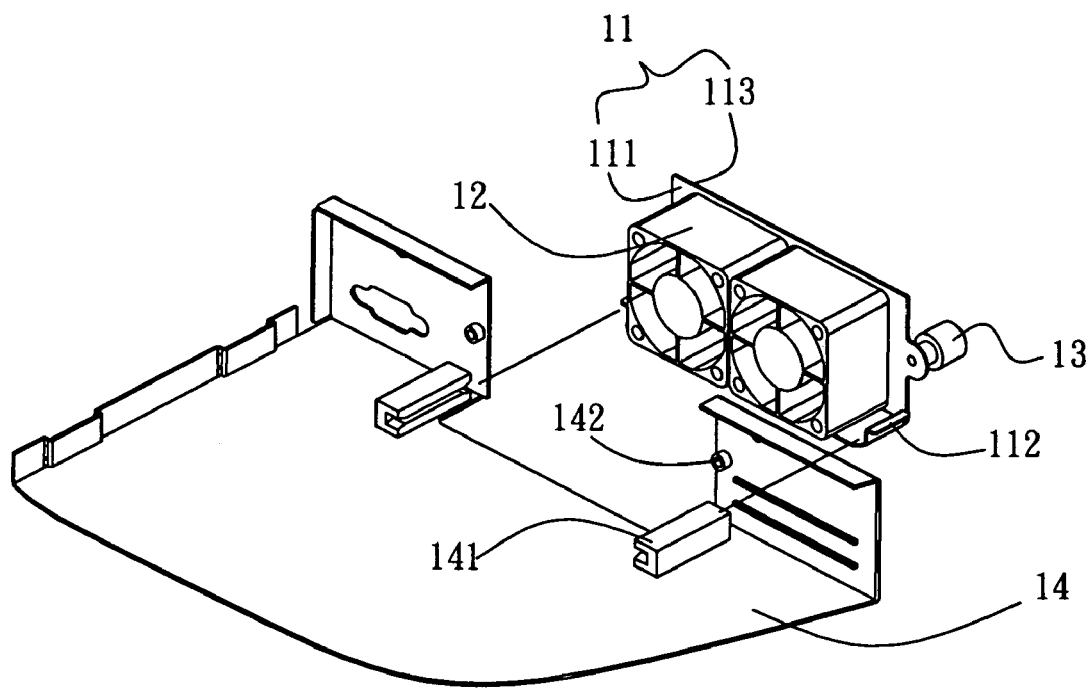
FIGS. 1a and 1b are schematic views showing a conventional structure for fastening the fan on the casing.
Figure 1B:
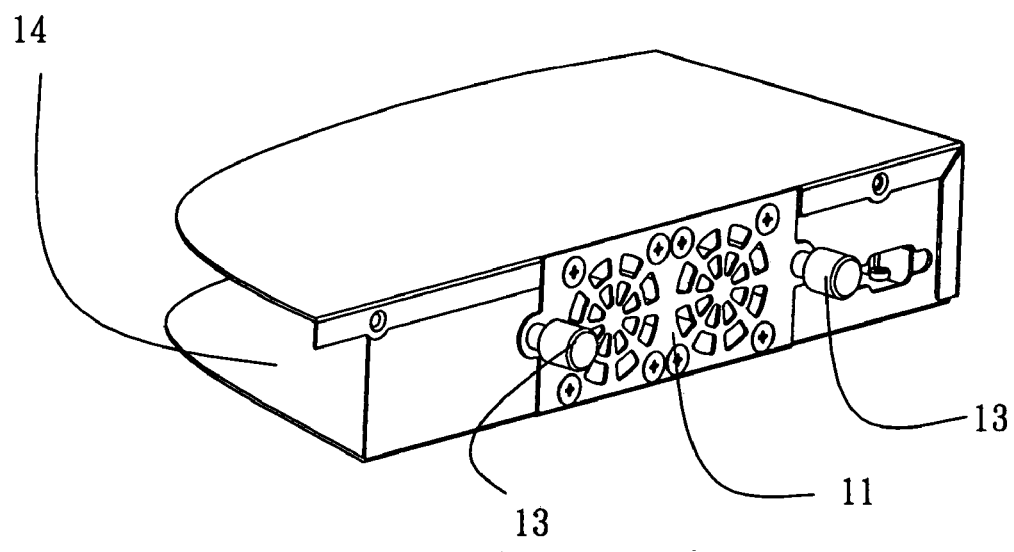
Figure 2:
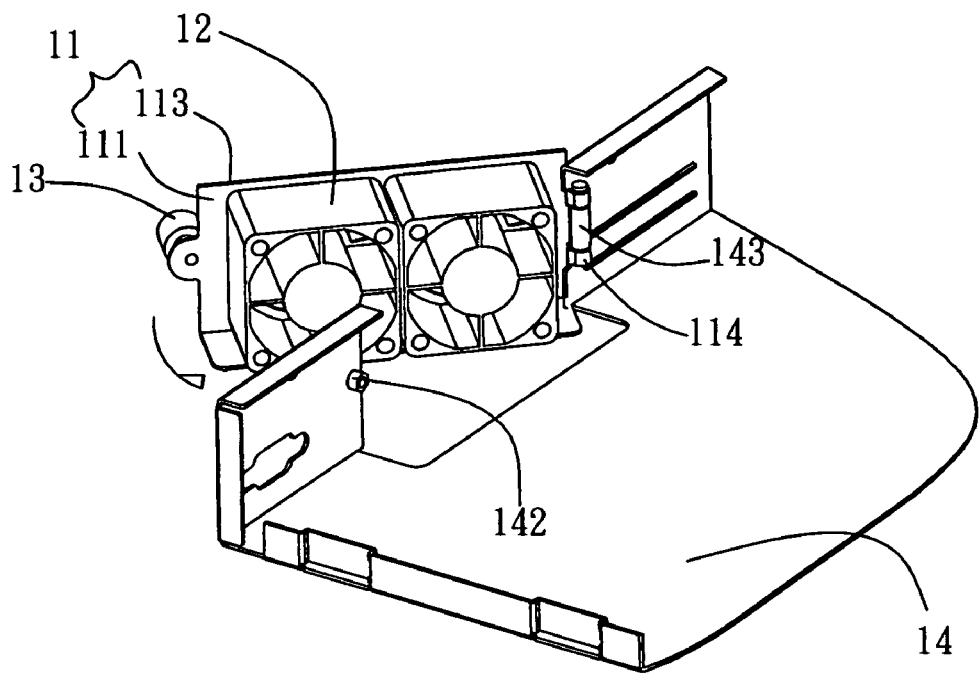
FIG. 2 is a schematic view showing another conventional structure for fastening the fan on the casing.
Figure 3:
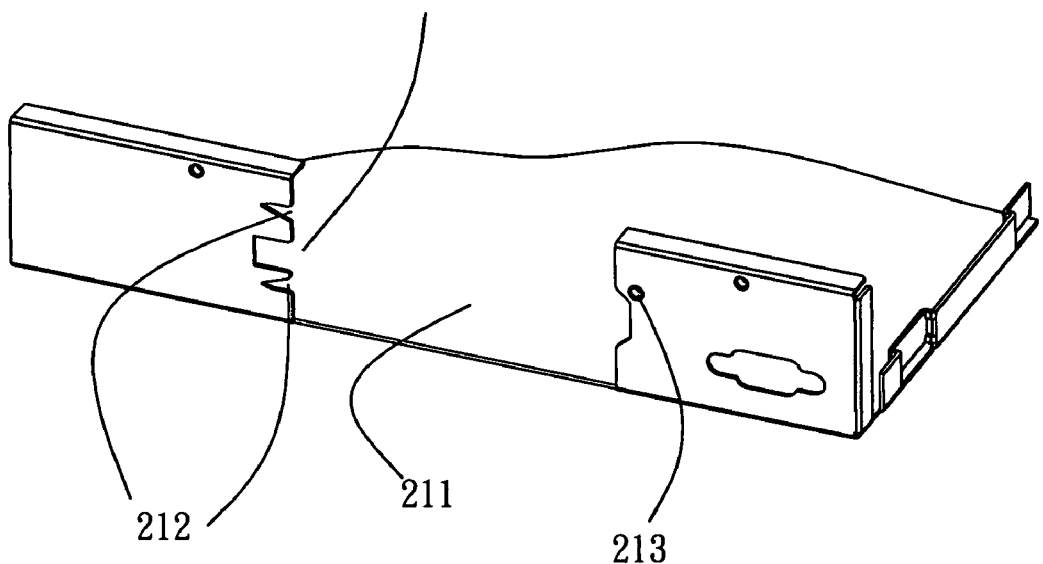
FIG. 3 is a schematic view showing a casing according to a preferred embodiment of the invention.
Figure 6A:
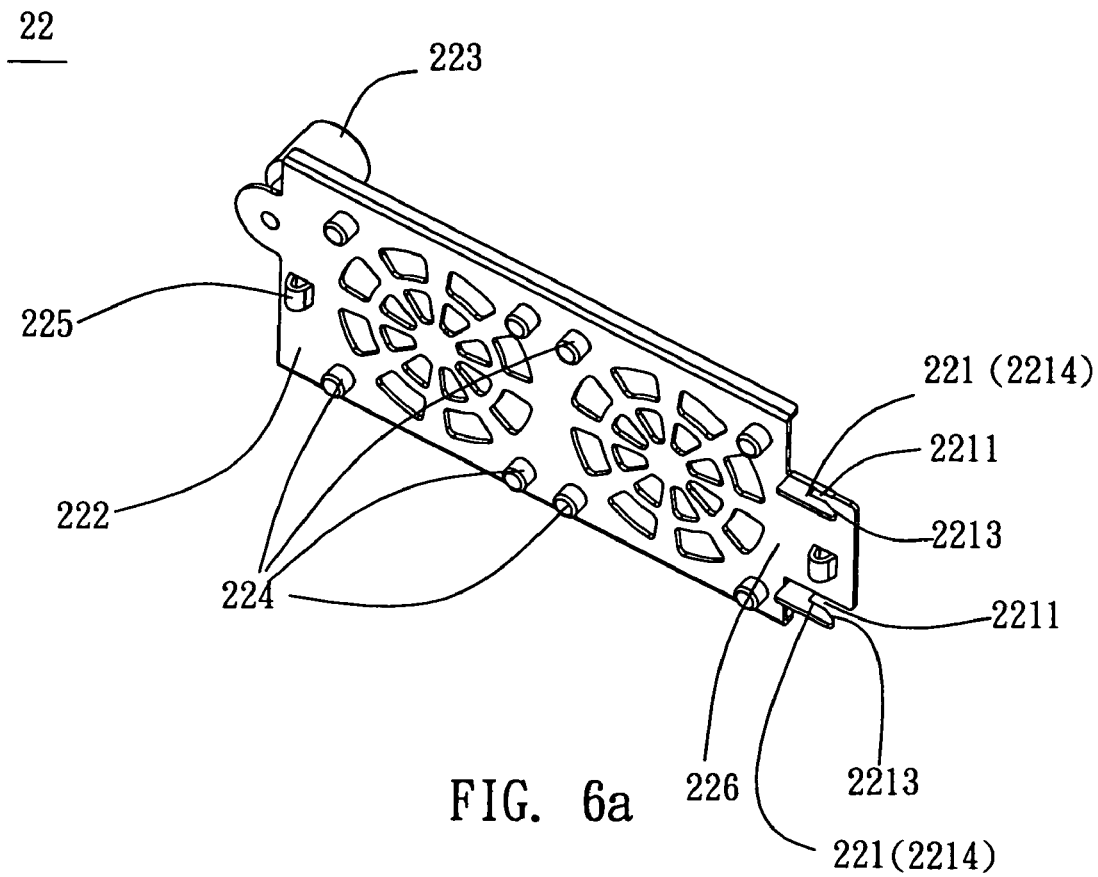
FIGS. 6a and 6b are schematic views showing a fan-fastening base according to the preferred embodiment of the invention.

With reference to FIG. 3, the casing 21 has a first opening 211, at least one second opening 212 and a first connecting portion 213. The shape and dimension of the first opening 211 corresponds to those of the fan-fastening base 22 as shown in FIG. 6a. In this embodiment, the shape of the first opening 211 is substantially rectangular. The first opening 211 is for accommodating a fan 12, and the fan-fastening base 22 covers the first opening 211.

Figure 4:
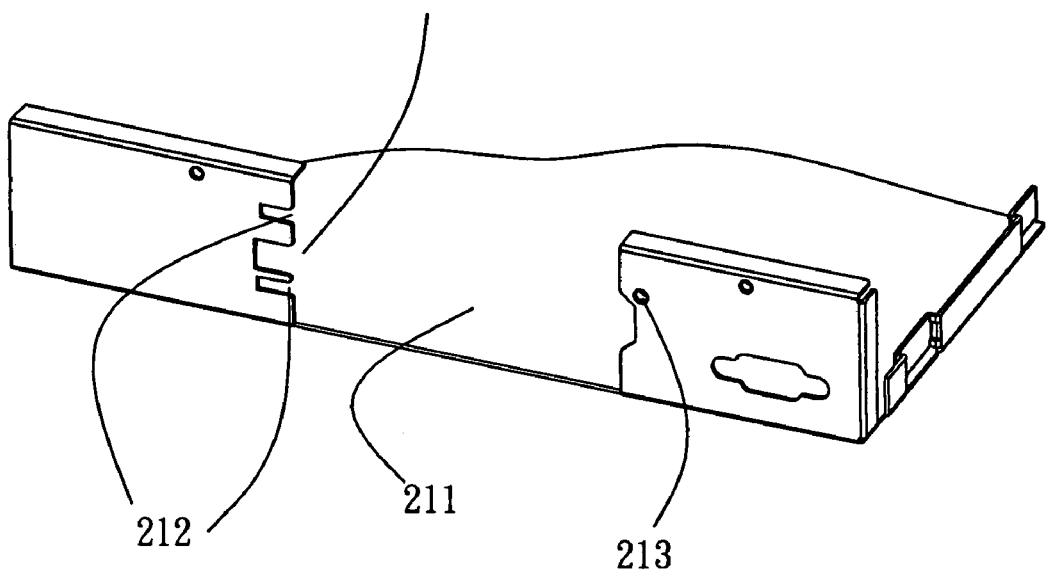
FIG. 4 is a schematic view showing another casing according to the preferred embodiment of the invention.

As shown in FIG. 3, the second opening 212 connects to a first side 2111 of the first opening 211. In the present embodiment, the shape of the second opening 212 is triangular. Alternatively, as shown in FIG. 4, the shape of the second opening 212 can be square and also connects to the first side 2111 of the first opening 211. The second opening is used for positioning and fixing the fan-fastening base 22 as shown in FIG. 6a. In this embodiment, the casing 21 includes two second openings 212.

Referring to FIG. 3 again, the first connecting portion 213 is a screw hole. In the current embodiment, the first connecting portion 213 is disposed on the casing 21, and the first opening 211 is located between the first connecting portion 213 and the second openings 212.

Figure 6B:
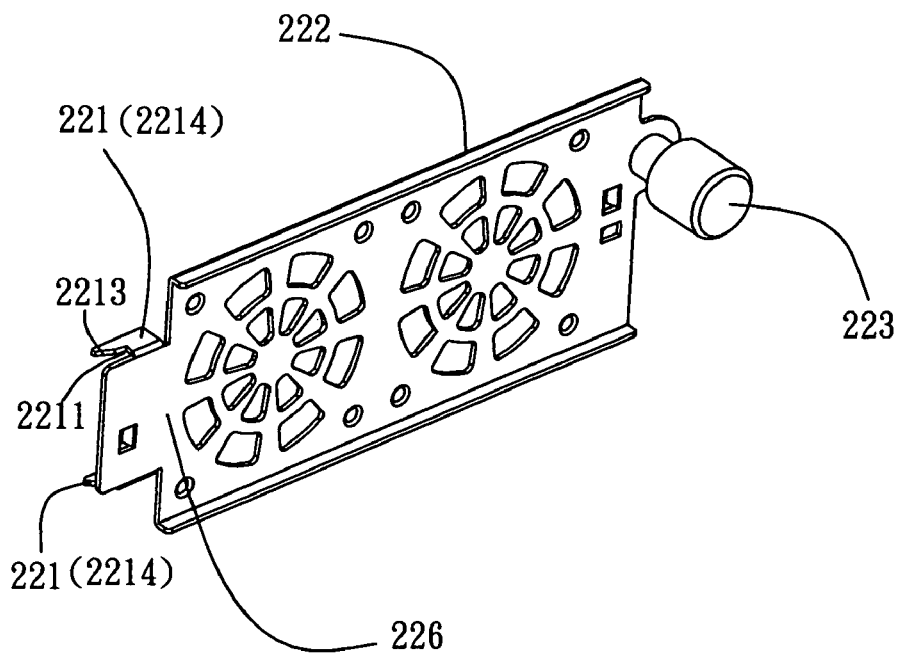

With reference to FIGS. 6a and 6b, the fan-fastening base 22 has a hook portion 221, a first surface 222 and a second connecting portion 223.

Figure 8A:
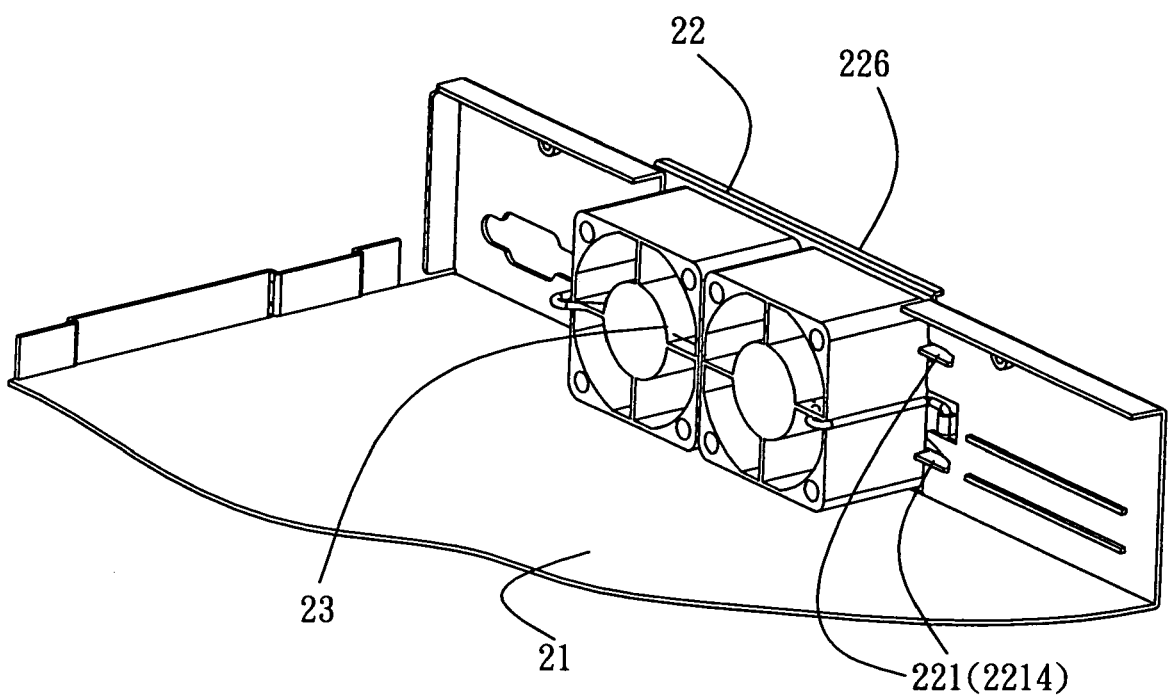
FIG. 8a is a schematic view showing the electrical apparatus according to the preferred embodiment of the invention.
Figure 8B:
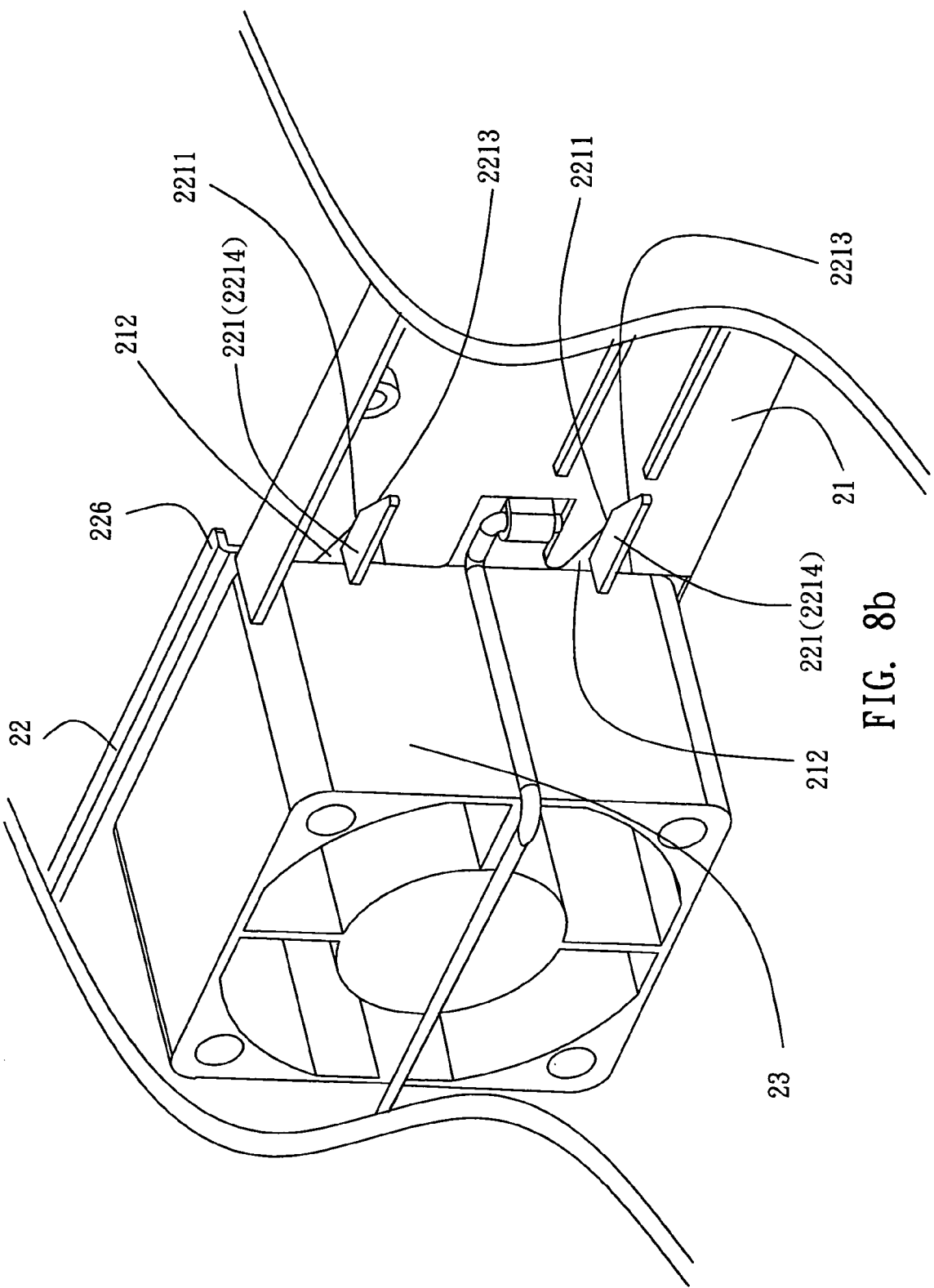
FIG. 8b is a schematic view showing a part of the electrical apparatus according to the preferred embodiment of the invention.

The hook portion 221 is a sheet-shaped body 2214 perpendicular to the first surface 222, and is buckled in the second opening 212. As shown in FIG. 8b, the fan-fastening base 22 of the embodiment has two sheet-shaped bodies 2214, and the sheet-shaped bodies 2214 and the fan-fastening base 22 are integrally formed. A slot 2211 is formed on the sheet-shaped body 2214 and partially separates the sheet-shaped body 2214 from the first surface 222. The sheet-shaped body 2214 is fastened to at least one part of the casing 21 by wedging the slot 2211 and the second opening 212 (as shown in FIG. 8a). The sheet-shaped body 2214 includes a guide angle 2213 to guide the sheet-shaped body 2214 itself into the second opening 212.

Figure 9:
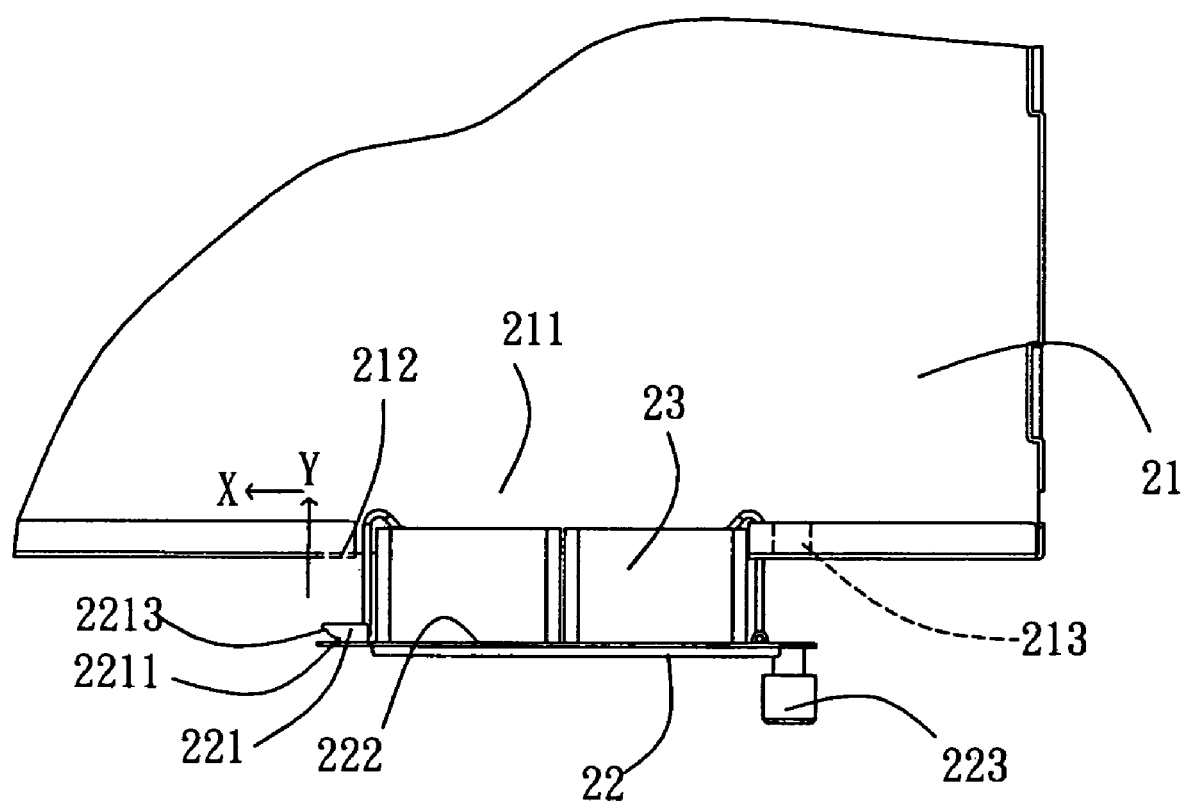
FIG. 9 is another schematic assembling view of the electrical apparatus according to the preferred embodiment of the invention.

With reference to FIG. 9, the second connecting portion 223 is disposed at the place corresponding to the first connecting portion 213. In the embodiment, the second connecting portion 223 is a screw, such as a floating screw.

Figure 5:
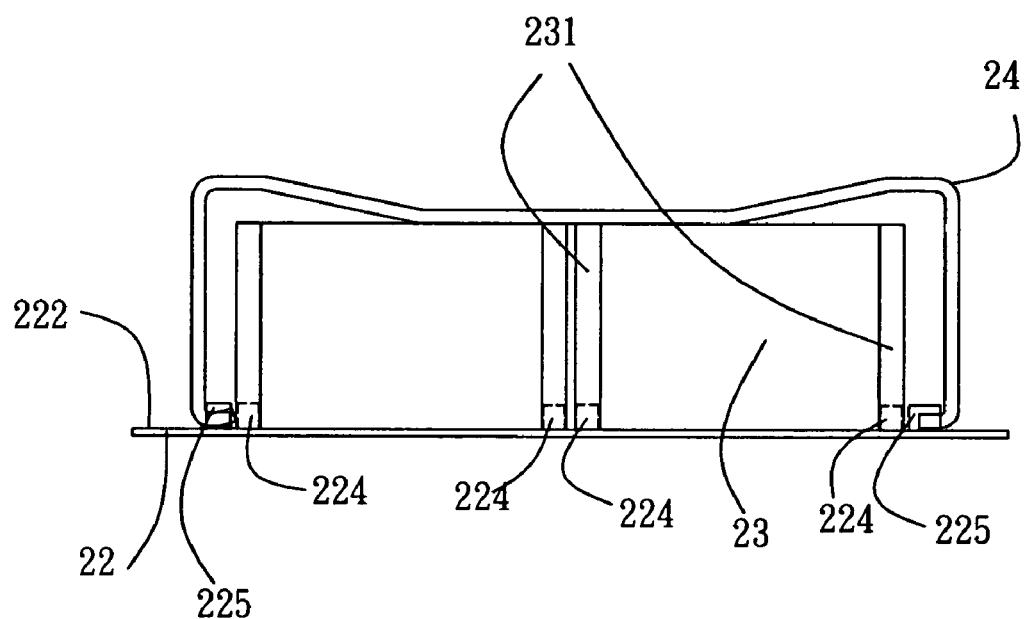
FIG. 5 is a schematic view showing a fan-fastening base with fans according to the preferred embodiment of the invention.

Referring to FIG. 5, the fan-fastening base 22 further includes a plurality of located portions 224 and a plurality of fixed portions 225 disposed on the first surface 222. In the present embodiment, the located portions 224 are pins and are respectively wedged to a plurality of corresponding position holes 231 of the fan 23. In other words, at least one fan 23 is fastened on the first surface 222. The fixed portions 225 are disposed on the first surface 222 of the fan-fastening base 22. The fixed portions 225, for example, can be hooks, hooking rings or buckling rings. In the present embodiment, the fixed portions 225 are hooking slots. A buckling element 24 is used to fastening the fan 23, and the two ends of the buckling element 24 respectively connect with the fixed portions 225.

To make the invention more comprehensive, two examples of assembling procedures of an electrical apparatus according to the embodiment of the invention will be described hereinafter.

Figure 7:
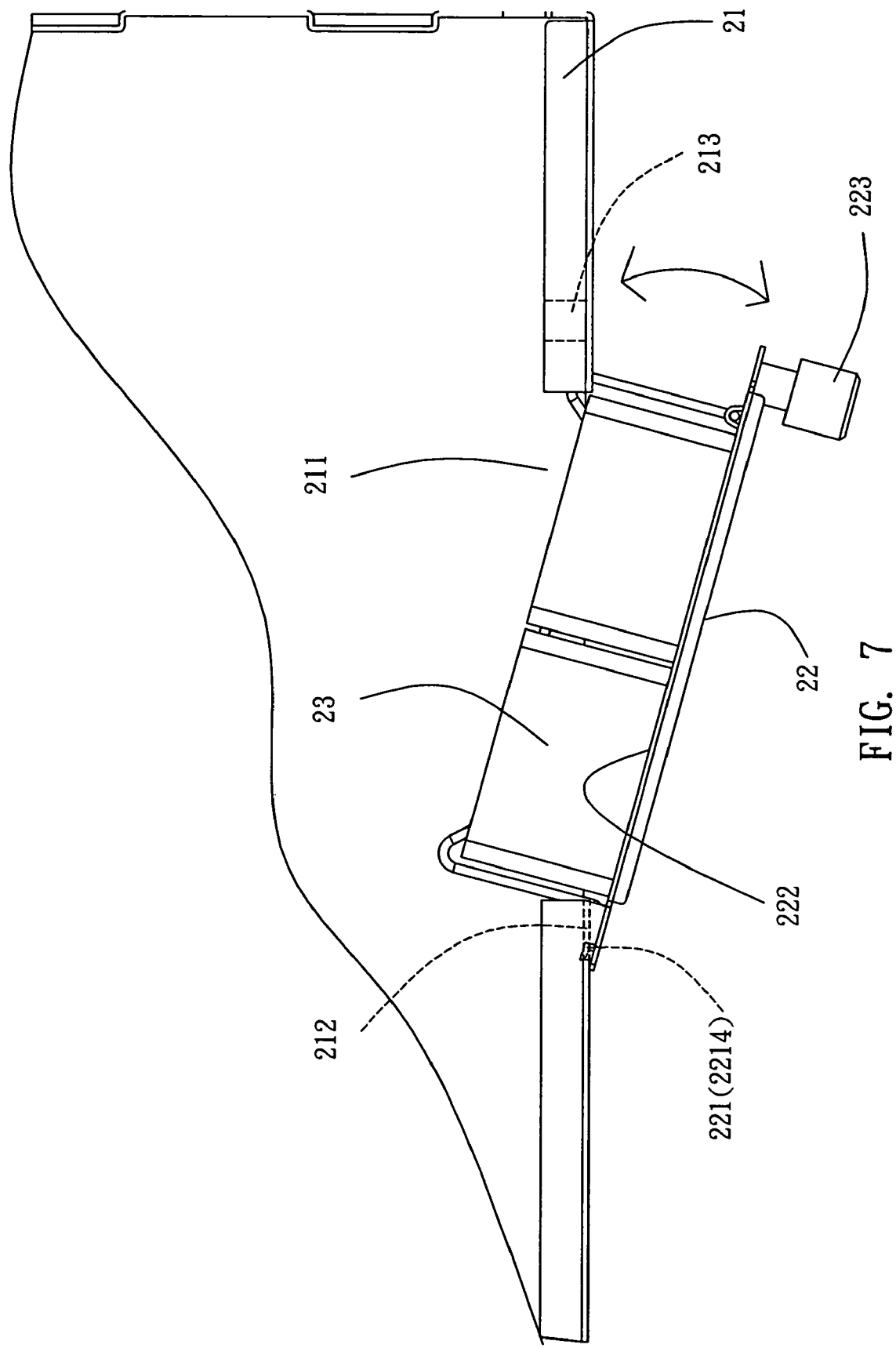
FIG. 7 is a schematic assembling view of an electrical apparatus according to the preferred embodiment of the invention.

FIGS. 7 and 8b show the first example of assembling procedures. The first surface 222 of the fan-fastening base 22, on which at least one fan 23 is mounted, is provided facing to the first opening 211. Then, as shown in FIG. 8b, the hook portion 221 is pushed to attach the second opening 212. That is, the second opening 212 is hooked with the hook portion 221 such that the hook portion 221 is fastened to at least one part of the casing 21 by wedging the slot 2211 and the second opening 212. After that, the hook portion 221 and the second opening 212 serve as a pivot to rotate the fan-fastening base 22, and the fan-fastening base 22 can achieve within the first opening 211. Herein, the second connecting portion 223 is connected with the first connecting portion 214. Finally, the fan-fastening base 22 can be perfectly assembled to the casing 21 as shown in FIG. 8a.

FIG. 9 shows the second example of assembling procedures. The first surface 222 of the fan-fastening base 22, on which at least one fan 23 is mounted, is provided facing to the first opening 211. Then, the fan-fastening base 22 is moved towards the Y direction, so that the fan-fastening base 22 can contact the first opening 211. Herein, the hook portion 221 passes through the second opening 212. After that, the hook portion 221 is moved towards the X direction with sliding along the guide angle 2213. Thus, the hook portion 221 can be moved towards the X direction and in contact with the second opening 212. Herein, the hook portion 221 is fastened to at least one part of the casing 21 by wedging the slot 2211 and the second opening 212. Therefore, the casing 21 can support and fasten the first end portion 226 of the fan-fastening base 22. The second connecting portion 223 is then connected with the first connecting portion 213. Finally, the fan-fastening base 22 can be perfectly assembled to the casing 21 as shown in FIG. 8a.

In summary, the hook portion buckles the second opening and the second connecting portion connects with the first connecting portion. Accordingly, the fan-fastening base can be fixed on the casing without the conventional guiding rails or pivot, which needs lots of screws for assembling the fan. Thus, the fan can be assembled or disassembled easily, which can save manpower and time-consumption for disassembling or assembling the fan. Furthermore, since the structure of the invention is simple, the cost for the casing and fan-fastening base can be decreased.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An electrical apparatus, comprising:
   a casing having a first opening, at least a second opening, and a first connecting portion, wherein the second opening is located at a first side of the first opening; and
   a fan-fastening base having at least a hook portion, a first surface and a second connecting portion,
   wherein at least one fan is fastened to the first surface, the hook portion buckles in the second opening, the first surface of the fan-fastening base faces to the first opening, the second connecting portion connects to the first connecting portion, and the second opening connects to the first side of the first opening, and
   wherein the fan-fastening base further comprises a plurality of located portions and a plurality of fixed portions disposed on the first surface, the located portions are respectively wedged to a plurality of corresponding position holes of the fan, the electrical apparatus further comprises a buckling element for fastening the fan, and the buckling element has two ends respectively connecting with the fixed portions.

2. The electrical apparatus of claim 1, wherein the first connecting portion is a screw hole, and the second connecting portion is a screw.

3. The electrical apparatus of claim 2, wherein the screw is a floating screw.

4. The electrical apparatus of claim 1, wherein the second opening has a shape of triangle or square.

5. The electrical apparatus of claim 1, wherein the hook portion is a sheet-shaped body having a slot perpendicular to the first surface, and the sheet-shaped body is fastened to at least one part of the casing by wedging the slot and the second opening.

6. The electrical apparatus of claim 5, wherein the sheet-shaped body and the fan-fastening base are integrally formed.

7. The electrical apparatus of claim 5, wherein the sheet-shaped body is perpendicular to the first surface of the fan-fastening base.

8. The electrical apparatus of claim 5, wherein the sheet-shaped body comprises a guide angle to guide the sheet-shaped body into the second opening.

9. The electrical apparatus of claim 1, wherein the hook portion is a sheet-shaped body perpendicular to the first surface, a slot is formed on the sheet-shaped body and partially separates the sheet-shaped body from the first surface, and the sheet-shaped body is fastened to at least one part of the casing by wedging the slot and the second opening.

10. An electrical apparatus, comprising:
   a casing having a first opening, at least one second opening and a first connecting portion, wherein the second opening is located at and connects a first side of the first opening, and the second opening has a triangle shape; and
   a fan-fastening base having at least a hook portion, a first surface and a second connecting portion, wherein at least one fan is fastened to the first surface, the hook portion buckles in the second opening, the first surface of the fan-fastening base faces to the first opening, the hook portion is a sheet-shaped body having a slot, the sheet-shaped body is fastened to at least one part of the casing by wedging the slot and the second opening, and the hook portion is perpendicular to the first surface of the fan-fastening base.

* * * * *